US007990101B2

(12) United States Patent
Hoff et al.

(10) Patent No.: US 7,990,101 B2
(45) Date of Patent: Aug. 2, 2011

(54) MULTI-CONFIGURABLE, SCALABLE, REDUNDANT BATTERY MODULE WITH MULTIPLE FAULT TOLERANCE

(75) Inventors: C. Michael Hoff, Boxborough, MA (US); Benjamin Craig Shaffer, Malden, MA (US); Greg Tremelling, Marlborough, MA (US); Jonah S. Myerberg, Waltham, MA (US); Ricardo Fulop, Brookline, MA (US); Andrew C. Chu, Cambridge, MA (US)

(73) Assignee: A123 Systems, Inc., Waltham, MA (US)

( * ) Notice: Subject to any disclaimer, the term of this patent is extended or adjusted under 35 U.S.C. 154(b) by 697 days.

(21) Appl. No.: 11/803,424

(22) Filed: May 15, 2007

(65) Prior Publication Data
US 2007/0279953 A1 Dec. 6, 2007

Related U.S. Application Data

(60) Provisional application No. 60/800,371, filed on May 15, 2006, provisional application No. 60/800,361, filed on May 15, 2006, provisional application No. 60/800,553, filed on May 15, 2006.

(51) Int. Cl.
*H02J 7/00* (2006.01)
(52) U.S. Cl. ........................................ 320/107; 320/134
(58) Field of Classification Search .................. 320/122, 320/134, 107; 324/434; 429/61
See application file for complete search history.

(56) References Cited

U.S. PATENT DOCUMENTS

| 4,564,798 | A | | 1/1986 | Young |
| 5,034,290 | A | * | 7/1991 | Sands et al. .................. 429/120 |
| 5,666,040 | A | | 9/1997 | Bourbeau |
| 5,705,929 | A | | 1/1998 | Caravello et al. |
| 6,104,967 | A | | 8/2000 | Hagen et al. |
| 6,262,561 | B1 | * | 7/2001 | Takahashi et al. ............ 320/104 |
| 6,404,166 | B1 | * | 6/2002 | Puchianu ...................... 320/116 |
| 6,479,185 | B1 | | 11/2002 | Hilderbrand et al. |

OTHER PUBLICATIONS

International Search Report, International Application No. PCT/US07/68968, mailed Mar. 3, 2008. (4 Pgs).

* cited by examiner

*Primary Examiner* — Edward Tso
*Assistant Examiner* — Aaron Piggush
(74) *Attorney, Agent, or Firm* — Wilmer Cutler Pickering Hale and Dorr LLP

(57) ABSTRACT

An energy delivery system includes at least one string of two or more energy delivery modules electrically coupled in series. Each energy delivery module includes one or more energy delivery devices for storing and delivering electrical current, and a module monitor for monitoring and controlling each of the energy delivery devices. Each string of energy delivery modules includes a string communication path accessible to each of the energy delivery modules, wherein the module monitor of each energy delivery module is operable to communicate information associated with its energy delivery module through the string communication path. Each string also includes a string manager device for communicating with each module monitor in the string, through the string communication path. The energy delivery system also includes a system controller for communicating with each string manager device through a system communication path.

22 Claims, 13 Drawing Sheets

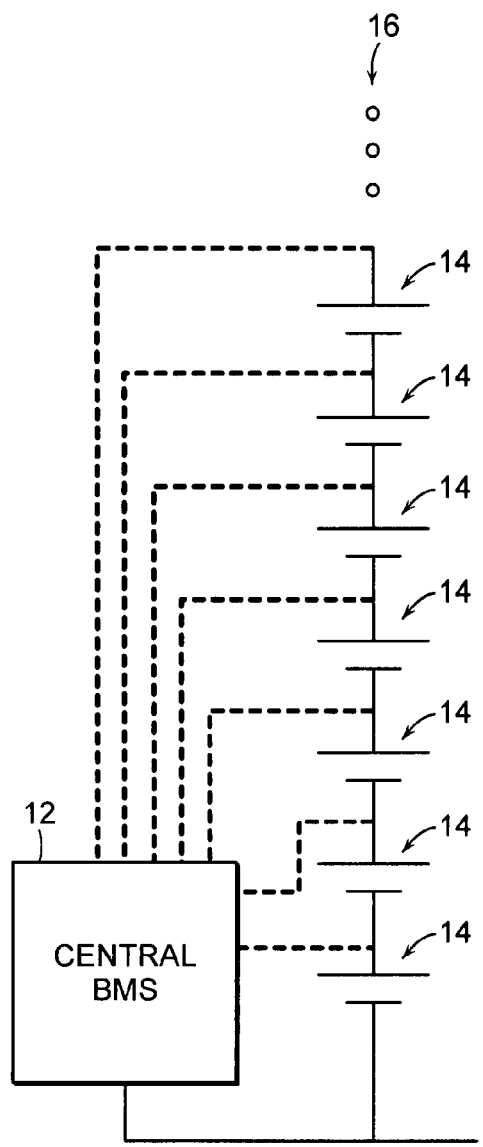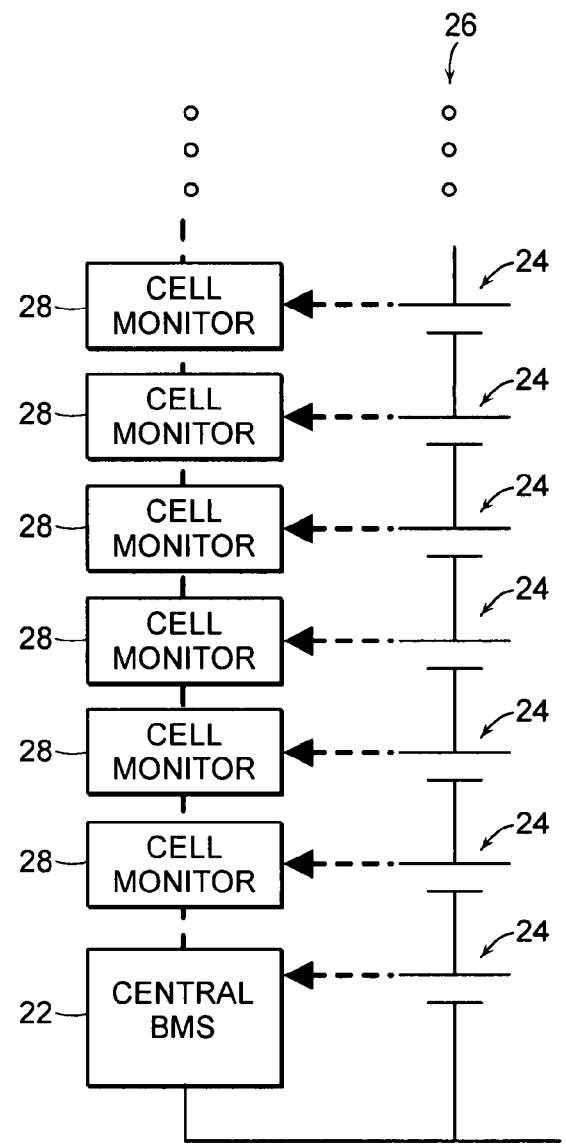
FIG. 1A
(Prior Art)
FIG. 1B
(Prior Art)

MULTI-CONFIGURABLE, SCALABLE, REDUNDANT BATTERY MODULE WITH MULTIPLE FAULT TOLERANCE

CROSS REFERENCE TO RELATED APPLICATIONS

This application claims benefit of the following Patent Applications:

U.S. Provisional Patent Application Ser. No. 60/800,371, filed May 15, 2006,

U.S. Provisional Patent Application Ser. No. 60/800,361, filed May 15, 2006, and U.S. Provisional Patent Application Ser. No. 60/800,553, filed May 15, 2006, the contents of which are incorporated herein by reference in their entirety.

BACKGROUND OF THE INVENTION

The present invention relates to energy delivery devices, and more particularly, to hierarchically arranged energy delivery systems that facilitate scalability and fault tolerance.

Many examples exist of parallel redundant systems, such as batteries, electric power supplies, computer hard drives, microprocessors, and communication links. Failover methods exist whereby failures of one or more components of the parallel redundant system does not result in overall system down time.

At present, state-of-the-art Energy Delivery Systems (EDSs) are often connected in parallel to provide such redundancy. Power supplies, batteries and generators are all well-known examples of such systems.

FIG. 1A illustrates a prior art battery management system (BMS) 10 for which a central battery management component 12 is connected to every battery cell or series element 14 in the string 16.

FIG. 1B illustrates a prior art BMS 20 for which the central battery management component 22 receives information from individual cell monitoring components 28 coupled to each cell or series element 24. In the architecture of FIG. 1B, data associated with each battery cell or series element 24 passes down-stream through cell monitoring components 28 before reaching the central battery management component 22.

A disadvantage of these redundant prior art systems is that their scalability in multiple directions is limited. Prior art BMS's are usually custom designed for a specific configuration of batteries, by number of cells when connected in series, and by size of battery when connected in parallel. In order to expand the size of the battery pack, new circuit cards must be designed with additional connections and sensing circuits.

Central battery management systems 10 (as shown in FIG. 1A) that interface to every cell or series element 14 suffer the disadvantage of having many wires connected throughout the battery pack. The long wires carrying voltage and temperature information about each of the battery elements are subject to significant electromagnetic interference, which degrades the signal integrity and lowers the measurement accuracy of the BMS 10. In addition, the wires may have high voltages relative to other wires connecting to the BMS circuit card that hosts the central battery management component 12. This requires careful PCB layout and connector design to prevent high voltage interference to other circuit functions and hazard free operation.

Series configured cell-monitoring solutions (as shown in FIG. 1B) suffer limitations of not being able to scale too many cells 24 in series due to the inability of the cell monitor devices 28 to pass through information from a large number of series connected cells. Typical pass-through methods cause each cell monitor 28 to accept information from down-stream monitors 28, buffer the information, append their own information, and then pass the packet upstream toward the next monitor closer to the central battery management component 22. As it travels from monitor to monitor, the packet increases in size. At some point, the packet may become too large to fit into the memory buffer of any one of the series monitors. Consequently, this scheme is generally limited to about 25 cells. In any case, as the series string become larger, the time it takes for information to ripple from the last monitor in the string to the BMS 22 becomes untenable for suitably responsive system operation.

Further, when one of the series elements fails, it generally cannot pass information from other modules in the series upstream to the BMS 22.

Finally, there is incrementally more cost to having an intelligent measuring and communicating device attached to each series element in the battery string. Usually, such systems can be scaled in either the parallel direction or the series direction, but not both. Meaning, such systems can add more parallel elements or add more series elements either in the design phase or in the assembly phase, but not both.

Prior art systems also suffer limitations of not being able to scale a large number of cells in series due to the inability for system controllers to communicate across high voltage boundaries.

Conventional battery module designs are usually large scale, custom packs designed for specific applications. More compact, scalable, and multi-configurable battery pack solution from one common base package is needed.

SUMMARY OF THE INVENTION

This embodiments described herein include a method of assembling modules, and/or configuring an assembly of modules, referred to herein as Energy Delivery Devices (EDDs). EDDs store and deliver energy, in a manner in which the assembly provides the summation of each of the constituent EDD's voltage, if they are connected in series, or the summation of each of the EDD's current capabilities, if they are connected in parallel. In general, an EDD can be a single battery cell or multiple battery cells with given voltage, current and energy ratings.

According to the described embodiments, an EDD that is an assembly of EDDs is monitored, managed and controlled as if it were a single EDD. Each EDD is monitored, managed and controlled by an electronic circuit (referred to herein as a "proxy") which reports status to an entity external to the EDD and performs control functions based on commands received from an entity external to the EDD.

In the described embodiments, EDDs can be wired in series to achieve a summation of voltage, or in parallel to achieve a summation of current capability, of the constituent EDDs. EDDs can be grouped in clusters of parallel EDDs or series EDDs or even a variety of parallel-series combinations, and still be managed, monitored and controlled simply as a single EDD to an external entity through one interface. In addition, the described methods allow for multiple failures of EDDs or communication elements to occur and not disrupt the communication to other working elements or EDDs.

In one aspect, the invention is an energy delivery system, including at least one string of two or more energy delivery modules electrically coupled in series. Each energy delivery module includes one or more energy delivery devices for storing and delivering electric current. The string also includes a module monitor for monitoring and controlling each of the energy delivery devices in the string. Each string of energy delivery modules further includes a string communication path accessible to each of the energy delivery modules. The module monitor of each energy delivery module is operable to communicate information associated with its energy delivery module through the string communication path. The system further includes a string manager device for communicating with each module monitor in the string, through the string communication path, and a system controller for communicating with each string manager device through a system communication path.

In one embodiment, the system further includes a device monitor for monitoring and controlling each energy delivery device. Each device monitor communicates with the module monitor such that the module monitor functions as a proxy for the device monitors and the energy delivery devices.

In another embodiment, the information associated with the energy delivery module includes electrical characteristics of the energy delivery module. In another embodiment, the information associated with the energy delivery module includes commands for controlling the energy delivery module. In yet another embodiment, the information associated with the energy delivery module includes instructions for configuring a predetermined arrangement of the modules within the system. In still another embodiment, the information associated with the energy delivery module includes environmental information associated with the module.

One embodiment further includes one or more isolating switches for isolating an abnormal module from the communication path.

In another embodiment, the communication path is a wire communication bus that supports an addressed communication protocol.

In yet another embodiment, the system includes only one string of modules, and the system controller subsumes the string manager for the string, so that the system controller provides functionality associated with the string manager.

In one embodiment, each string manager accommodates more or fewer modules in the string, and the system manager accommodates more or fewer string managers in the system.

In another aspect, an energy delivery system includes one or more energy delivery devices. Each energy delivery device is operable to store energy provided to it and deliver stored energy as electrical current. The system further includes one or more electrical devices for providing functionality related to at least one of monitoring, controlling and managing the one or more energy delivery devices. The system also includes a printed circuit board with electrical contacts for electrically coupling the energy delivery devices to the printed circuit board, and electrical conductors that electrically couple the energy delivery devices to one another in a predetermined arrangement. The electrical conductors also couple the energy delivery devices to the one or more electrical devices. The one or more energy delivery devices and the one or more electrical devices are mounted directly to the printed circuit board.

In another aspect, a method of assembling an energy delivery system includes providing a pair of endcaps. The endcaps include posts for constraining an array of energy delivery devices in a predetermined arrangement, electrically conductive plates for providing an electrical connection to the energy delivery devices, and access ports for accessing the electrically conductive plates through the endcaps at locations corresponding to electrical ports of the energy delivery devices. The method further includes disposing the energy delivery devices between the endcaps, such that the posts constrain the energy delivery devices in the predetermined arrangement, and the electrical ports of the energy delivery devices are in contact with the electrically conductive plates. The method also includes securing the endcaps together, so as to clamp the batteries between the endcaps in the predetermined arrangement, and applying heat through the access ports to the electrically conductive plates, so as to form an electrically conductive bond between the electrical ports of the energy delivery devices and predetermined locations on the electrically conductive plates.

In one embodiment, applying heat through the access ports further includes resistance welding the conductive plate.

One embodiment further includes disposing a printed circuit board at a top portion of the endcaps. One or more conductive tabs extending from the conductive plates provide an electrical coupling between the cells and the printed circuit board.

Another embodiment further includes providing a frame for arranging two or more modules in a predetermined configuration.

In another aspect, an energy delivery system includes a pair of endcaps that include posts for constraining an array of energy delivery devices in a predetermined arrangement, electrically conductive plates for providing an electrical connection to the energy delivery devices, and access ports for accessing the electrically conductive plates through the endcaps at locations corresponding to electrical ports of the energy delivery devices. The energy delivery devices are disposed between the endcaps, such that the posts constrain the energy delivery devices in the predetermined arrangement, and the electrical ports of the energy delivery devices are in contact with the electrically conductive plates. The endcaps are secured together, so as to clamp the batteries between the endcaps in the predetermined arrangement. An electrically conductive bond is formed between the electrical ports of the energy delivery devices and predetermined locations on the electrically conductive plates.

One embodiment further includes a printed circuit board disposed at a top portion of the endcaps. The printed circuit board is electrically coupled to one or more tabs extending from the electrically conductive plates.

Another embodiment further includes an electrical connector for coupling to a communication path. The electrical connector is electrically coupled to one or more electrical devices mounted on the printed circuit board.

In another embodiment, the energy delivery devices are arranged in groups of alternating polarity, such that the groups of energy delivery devices are electrically connected in series.

In yet another embodiment, the groups of energy delivery devices are electrically connected in parallel.

BRIEF DESCRIPTION OF DRAWINGS

The foregoing and other objects of this invention, the various features thereof, as well as the invention itself, may be more fully understood from the following description, when read together with the accompanying drawings in which:

FIG. 1A illustrates a prior art battery management system.

FIG. 1B illustrates another prior art battery management system.

DESCRIPTION OF THE PREFERRED EMBODIMENTS

Figure 2:
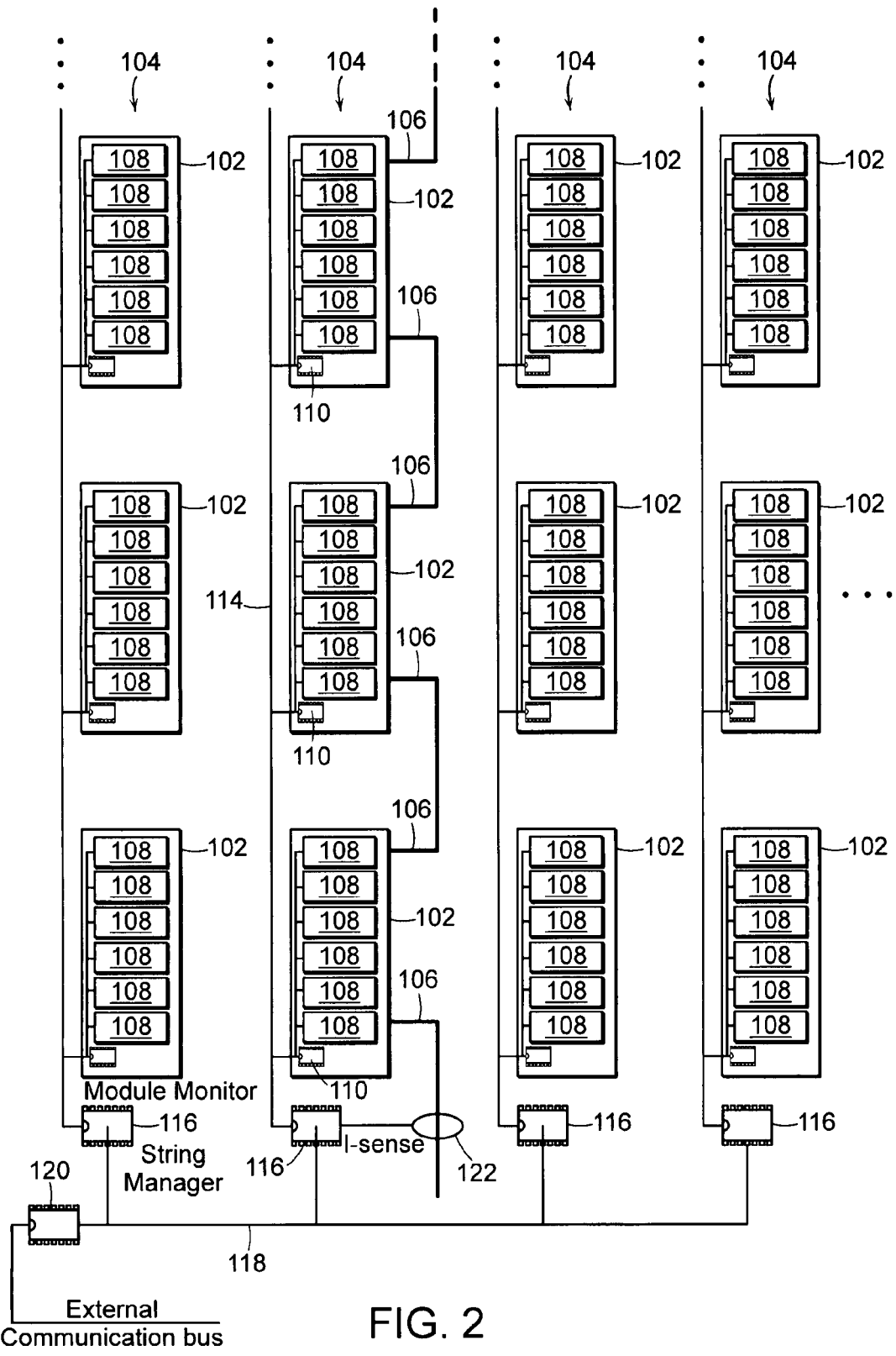
FIG. 2 shows an embodiment of an EDD pack according to one aspect of the invention.

In the described embodiments, a collection of EDD modules can be configured in a parallel and/or series configuration within an EDD pack 100. FIG. 2 shows a generalized diagram of such a configuration, in which EDD modules 102 are wired in a series string 104 (vertically in the FIG. 2) to obtain the desired voltage on the terminals 106 of the pack 100. Each of the modules 102 can be constructed to have one or more cells 108 in series, by one or more cells 108 in parallel. Each of the cells 108 includes a positive electrical port and a negative electrical port. Similarly, each of the modules 102 includes a positive electrical port and a negative electrical port (i.e., the terminals 106), which represents some composite arrangement of the cells 108 within the modules.

For the sake of clarity, the details of only one string 104 are shown in FIG. 2, but it should be understood that these details are common to all of the strings. Further, it should be understood that although the detailed string shown includes three modules 102, each string can have more or fewer modules 102. Finally, although FIG. 2 shows four strings 104 in the pack 100, a pack as described herein can have more or fewer strings.

Each module 102 includes a module monitor 110, which monitors and manages the cells 108 in that module 102. The cell monitor 110 may measure various aspects of the module 102, such as voltage, current, environmental conditions (e.g., temperature) and fault status, among others. For example, the cell monitor may measure the current the module generates via a current sensor 122 coupled to the monitor 110. In one embodiment, the module monitor 110 is an electrical device that includes a microprocessor. In other embodiments the module monitor 110 may include, but is not limited to, a field programmable gate array (FPGA) or an application specific integrated circuit (ASIC). In general, the module monitor 110 can be any electrical circuit that provides processor/controller functionality.

Each module monitor 110 sends information associated with its module 102, and receives information for management of the module 102, through a communication path 114. In one embodiment, the communication path 114 includes a wire bus, although in other embodiments the communication path 114 may include media such as fiber optics, an audio channel, an RF or other wireless channel, or in general any media capable of conveying information.

For each string of EDD modules 102, a string manager 116 communicates with the module monitors 110 within that string through the communication path 114. In one embodiment, the string manager 116 is an electrical device including a microprocessor. In other embodiments the string manager 116 may include, but is not limited to, a field programmable gate array (FPGA) or an application specific integrated circuit (ASIC). In general, the string manager 116 can be any electrical circuit that provides processor/controller functionality.

Each string manager 116 receives module information from the module monitors 110 within its string, and sends information to the module monitors 110 related to management of the modules 102 within the string.

Multiple strings 104 can be connected in parallel inside the pack 100 for further redundancy or energy scalability. FIG. 2 shows a pack controller 120 in communication with a row of string managers 116 through an pack communication bus 118. As with the communication path 114 described above, the communication bus 118 can in general be any media capable of conveying information.

The pack controller 120 receives information associated with each module 102 through the associated module monitors 110 and string managers 116, and provides control and management information to the modules 102 through the same path, as shown in FIG. 2. In some embodiments, the pack 100 utilizes separate communication paths for receiving module information and distributing management information. Information the pack manager 120 sends to the modules 102 may include, for example, commands for adjusting or balancing the cells 108 within the module 102, or instructions related to a desired module arrangement within the cells.

The hierarchy described above can grow or shrink, depending on the requirements of the EDD pack 100. For example, if the EDD pack 100 consists of only one string 104, then the pack controller 120 communicates with a single column of EDD module monitors 110.

In summary, at the lowest level of the EDD pack 100, a module monitor 110 monitors and manages the cells 108 in that module 108 and passes information to upper level monitors via a communication bus shared by other EDDs. At the highest level, a battery management system (BMS—also referred to herein as the pack controller 120) communicates with lower level monitors independently, one at a time, on the shared communication bus. Where there are multiple strings of EDD modules, the BMS 120 communicates with string managers 116 that each act as a proxy to the modules within its string and communicates with each of the module monitors. Where there is only one string of modules 102, the BMS 120 communicates directly to the module monitors.

Figure 3:
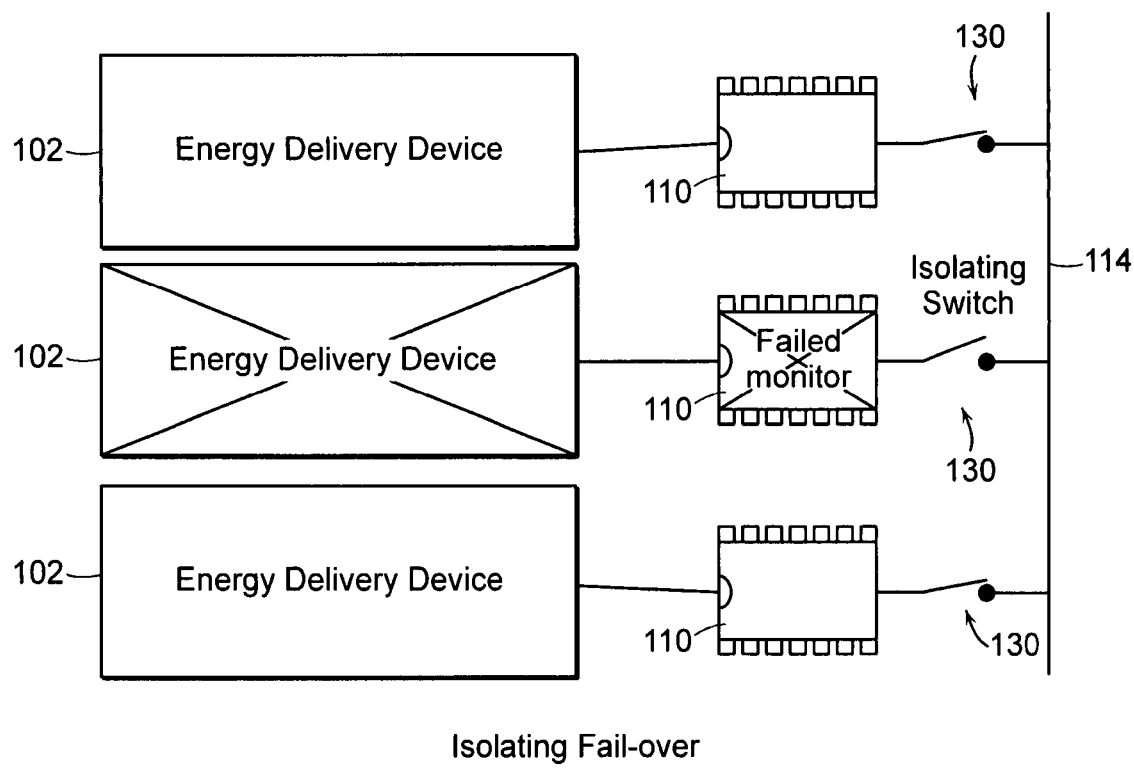
FIG. 3 shows a failed processor isolated when a failure is detected.

If a failure occurs in any one EDD module monitor 102, other EDD monitors 102 continue to communicate to the string manager 116 proxy across the common bus, from which the failed processor can be isolated when an abnormal condition (e.g., failure, malfunction or degradation) is detected as shown in FIG. 3. In one embodiment, the isolating switch 130 is included as a discrete component on the module 102 so that isolation is still possible in the event that the module monitor is completely non-functional. In other embodiments, the isolating switch 130 is integrated into the module monitor using a fail-safe design that increases the likelihood that the isolating switch remains functional even when other portions of the module monitor 110 cease functioning.

As described above, each EDD module 102 includes a module monitor that communicates on the communication path 114. In order to identify themselves on this common bus, each of the module monitors participates in an identification procedure when the BMS 120 initializes. In one embodiment, the BMS 120 provides each module monitor 110 with a unique address. Once each of the modules receives its address, the BMS 120 can issue control or query commands to any one of the EDD modules, and receive information specific to that module. To issue a command, the BMS 120 sends a command code and address information on the pack communication bus 118 to the string managers 116, which in turn convey this information to the module monitors 110 via the communication bus 114. This allows for global broadcast messages as well as module-specific messages. In the case of global broadcast messages, the address information may include a global address recognized by all of the module monitors, or it may include each individual module address. For module-specific messages, each module monitor 110 receives and interprets the message, but only the module 102 that has the matching address responds to the command. Once a module 102 receives the command, it responds by sending data responsive to the command on the communication path 114. The corresponding string manager 116 receives the data and conveys it to the BMS 120 via the pack communication bus.

Hereinafter, when the description relates that the BMS 120 communicates with a module monitor 110, or a module monitor communicates with the BMS 120, it is assumed that the communication passes through the string managers 116.

Communication Protocol

Figure 4:
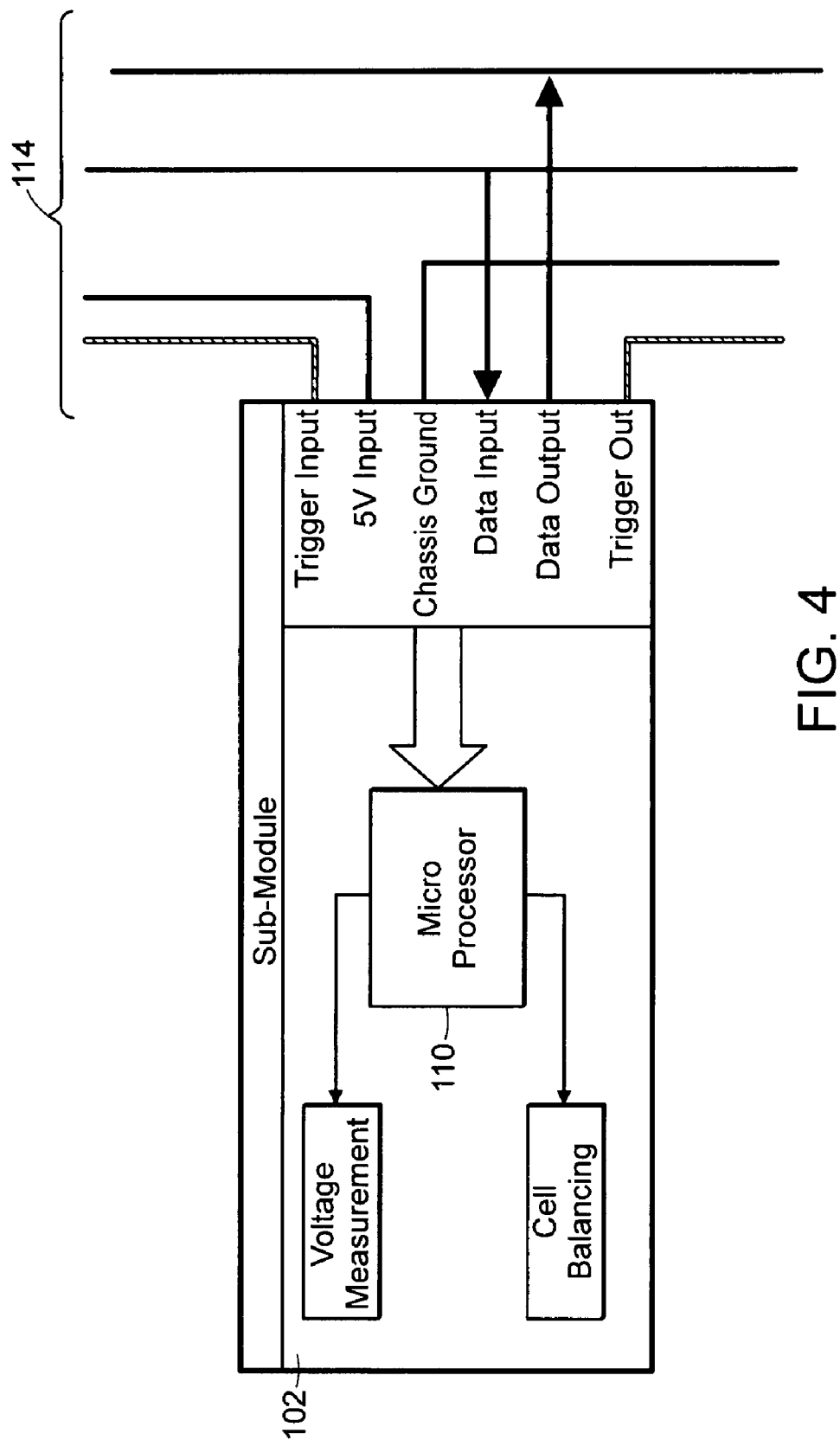
FIG. 4 shows one embodiment of communication connections between an EDD module to the communication path.
Figure 5:
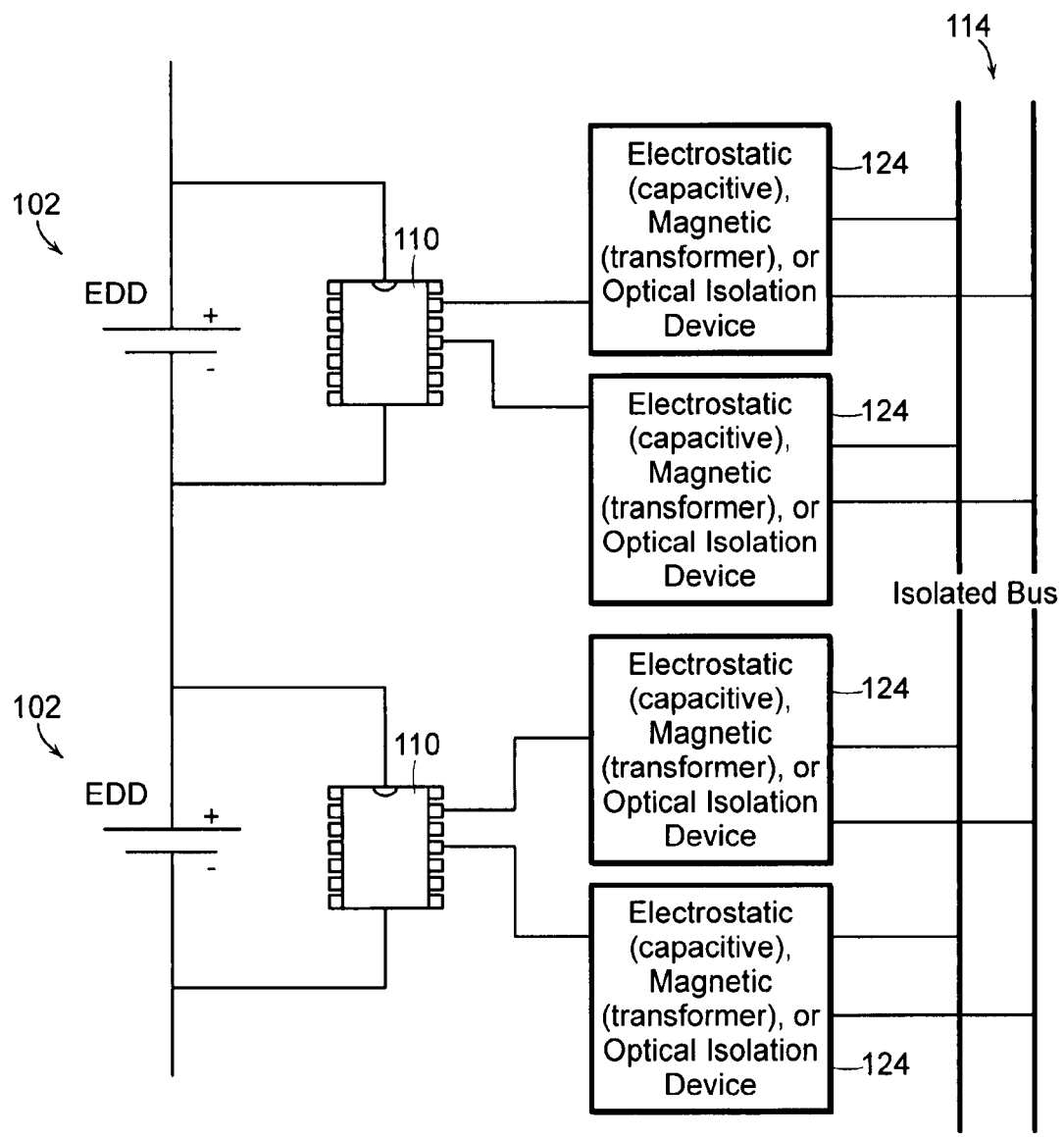
FIG. 5 shows an exemplary embodiment of an EDD module with isolation devices between the communication path and the module monitors.

The communication path 114 and the pack communication bus 118 may be any one of serial, CAN, LIN, SPI, I2C or other communication techniques known in the art that implement an addressed protocol over a shared physical medium. However, because of the high voltages associated with each of the modules 102 relative to the BMS reference, the communication path 114 (and in some embodiments, the pack communication bus 118) are isolated using isolation devices 124 known in the art (e.g., optical, magnetic or RF), between the communication path 114 and each of the modules 102. FIG. 4 shows one embodiment of the EDD module 102 communication connections to the communication path 114. FIG. 5 shows an exemplary embodiment with isolation devices 124 between the communication path 114 and the module monitors 110.

Assigning Addresses

As described above, when the BMS 120 initializes, it provides addresses to each of the module monitors 110. Although other procedures may be used to provide the addresses, the description to follow is the procedure used in one exemplary embodiment.

The BMS 120 sends a discrete trigger signal to the first connected EDD module monitor 110 on an trigger input line. In some embodiments, the trigger input line is a discrete path, while in other embodiments the trigger line is part of a communication protocol.

In response to the trigger signal, the module monitor 110 sends an acknowledgement message to the BMS 120. The BMS 120 returns an address assignment over the communication path 114 the string manager 116. Although every module monitor 110 in the string receives the address assignment, only the module monitor 110 that receives a trigger signal assigns itself the new address.

Once the BMS 120 has successfully assigned an address to the first connected module, i.e., the "current module" (the module currently being assigned an address), the BMS 120 sends an "activate trigger" message to that current module, causing it to activate the trigger signal to the next connected module. The BMS sends the next address to the modules 102, which is accepted by the second connected module since its trigger signal is active (i.e., it is the new "current module").

Once the BMS 120 has successfully assigned an address to the second connected module, the BMS 120 sends a de-activate trigger message to the first connected module (i.e., the "current module-1"), followed by an activate trigger message to second connected module, which makes the third connected module the "current module." This re-assignment of the trigger signal thus moves the "current module" role along the string from the second connected module to the third connected module, and moves the "current module-1" role from the first connected module to the second connected module.

The BMS 120 then sends the next address, which is accepted by the new "current module" (i.e., the third connected module) because its trigger is now active. This address assignment process continues until the last module has established its address. The BMS 120 has information regarding how many modules there are configured in its host EDD pack 100, so it continues to assign addresses until all modules are assigned.

If at some point during the operation of the EDD pack 100, a module monitor 110 does not respond to a trigger signal within a specified period of time, the BMS 102 concludes that the non-responsive module has malfunctioned, which results in a "failure to start" condition.

Figure 6:
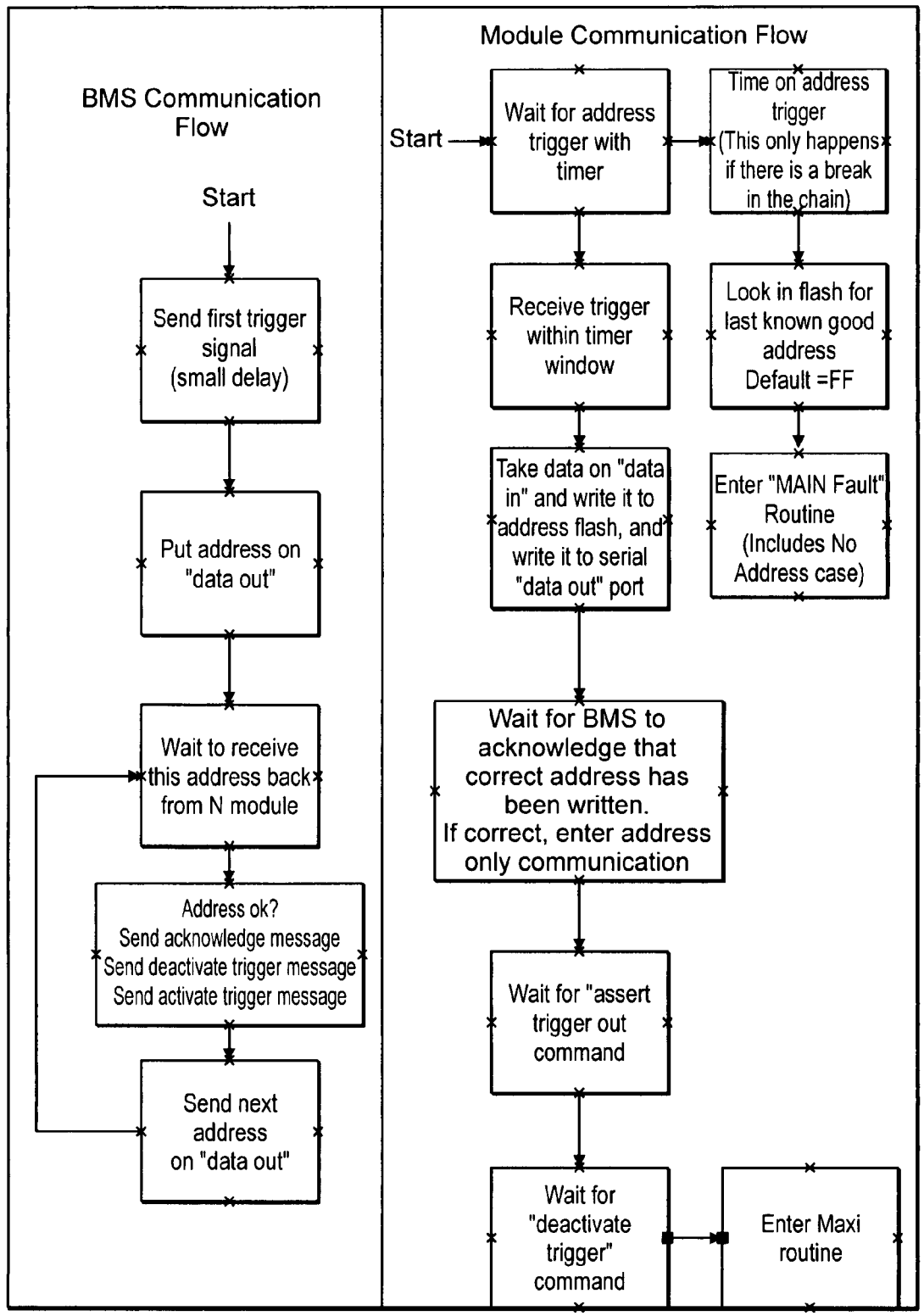
FIG. 6 shows a flow diagram of a procedure for assigning addresses to modules within the EDD pack.

Once all of the modules monitors 110 have been assigned addresses, the module monitors 10 can be accessed individually in any arbitrary order by the BMS 120. An example flow chart for the procedure described above is shown in FIG. 6.

Value of Shared Bus Protocol/Leveraged Measurement Circuitry

During operation, the BMS 120 can acquire all of the voltages of the cell modules 102 at exactly the same time. It accomplishes this by sending a global request for cell voltages that is recognized and accepted by all of the modules 102. The module monitor 110 for each module 102 acquires a "snapshot" (i.e., a sample) of the voltages associated with its constituent cells upon receiving a snapshot command from the BMS 120. When the module monitors 110 receive the snapshot command, they all take a snapshot of their cells at substantially the same time.

The BMS 120 then systematically addresses each module to request the sampled voltage information. The advantage to this technique is that the voltage information of each cell is relevant to a specific time. This time could be when the current of the pack 100 was sampled, or when the BMS 120 detected some other event. Because all cell voltages can be correlated with current, it is possible to calculate State Of Health, or impedance of the pack and cells.

Figure 7:
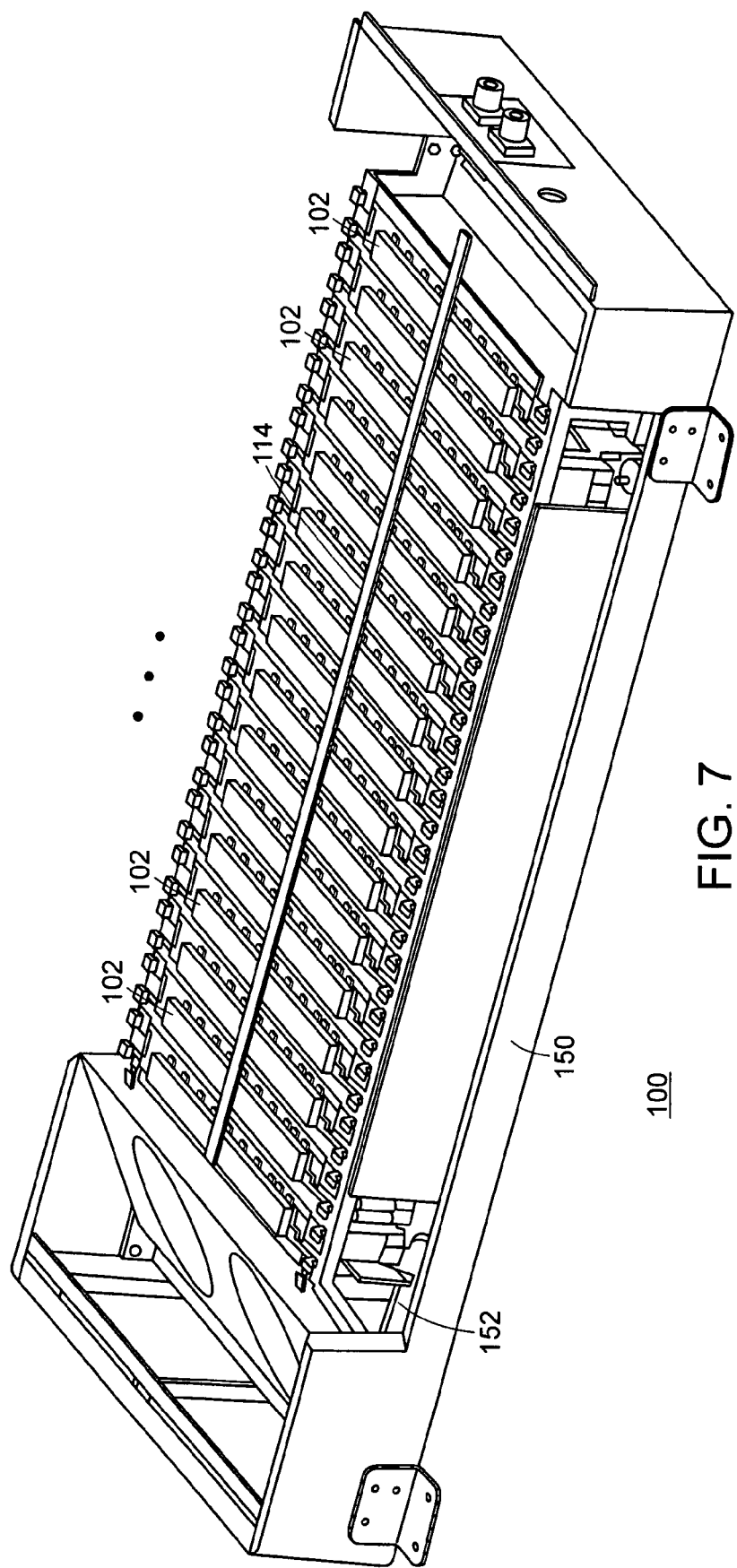
FIG. 7 is an embodiment of an EDD module assembly according to one aspect of the invention.

One embodiment of an EDD pack as described herein is shown in FIG. 7. A base pan 150 provides the basic housing for the EDD pack 100. A frame 152 mounted within the base pan 150 provides the structure for supporting the modules 102. The communication path 114 is shown electrically coupled to the modules 102.

Figure 8:
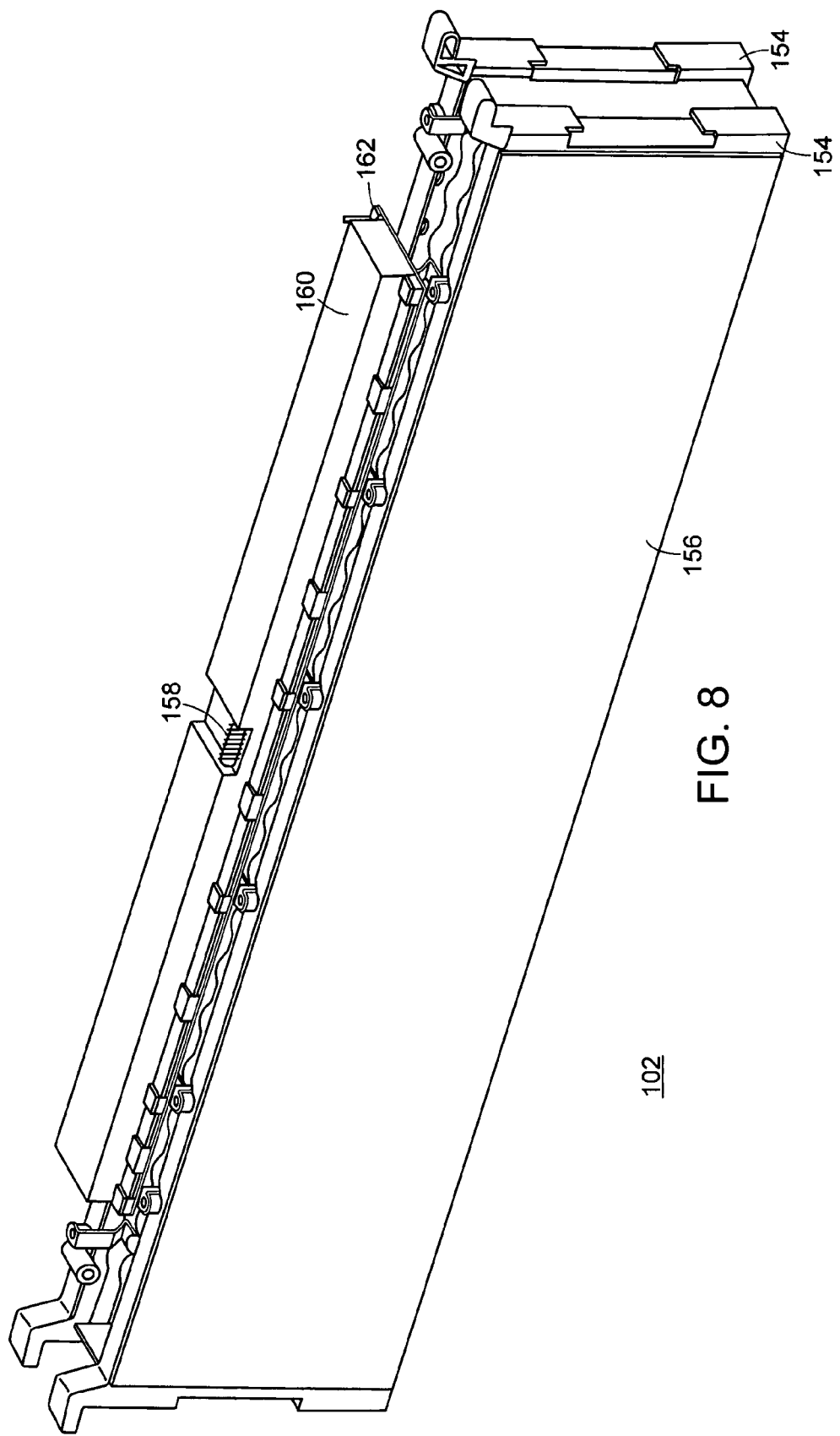
FIG. 8 shows another view of the components of the EDD module of FIG. 7.

A portion of an individual module 102 from the EDD pack of FIG. 7 is shown in FIG. 8. Two endcaps 154 are situated on either side of an arrangement of cells 108 (the cells are not visible in this figure—refer to FIG. 10). In this embodiment, the endcaps 154 are made of injection molded UL 94-V0 rated PC/ABS material, although other low-conductive materials known in the art may also be used.

An insulator sheet 156 is shown covering the near endcap 154. In this embodiment, the insulator sheet 156 is a FR polypropylene sheet with low electrical conductivity to prevent electrical conduction between adjacent modules 102. However, other embodiments may use other insulating materials known in the art for the insulator sheet 156.

FIG. 8 also illustrates an electrical connector 158 for providing a physical and electrical connection between the communication path 114 and the module monitor 110 of the module 102. A dust cover 160 provides protection from the external environment for the printed circuit board 162 which hosts the module monitor 110 and other electrical components associated with the module 102.

Figure 9:
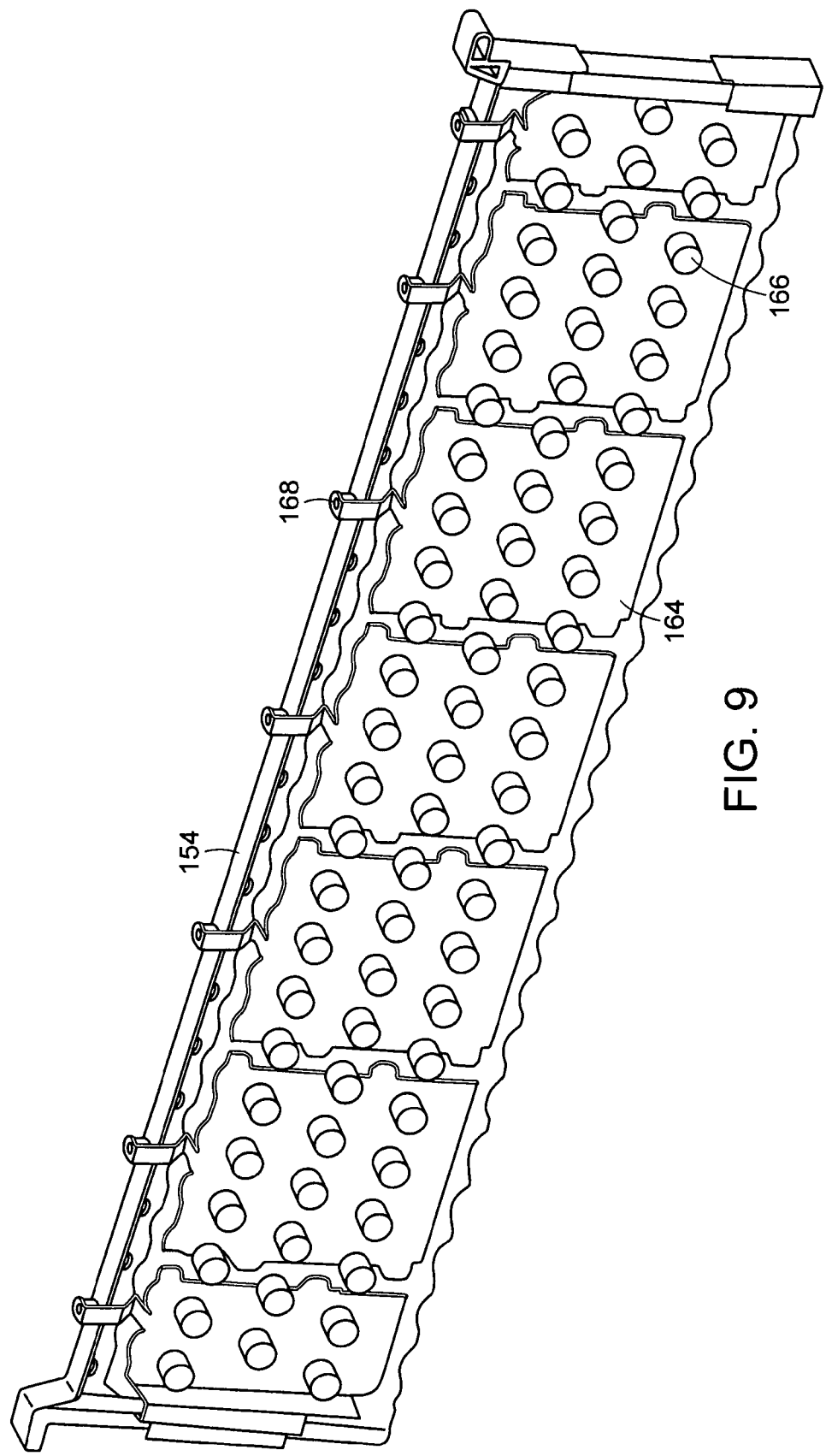
FIG. 9 shows yet another view of the components of the EDD module of FIG. 7.

FIG. 9 shows a detailed view of one of the endcaps 154. Electrically conductive plates 164 are situated on the interior surfaces of the endcaps 154 for providing an electrical connection to the electrical ports of the cells 108. In this embodiment, the plates 164 are Ni-200 Weld Strap, although other conductive materials know in the art may also be used.

A number of posts 166 extend from the endcap 154, through the conductive plates 164. The posts provide mechanical boundaries and structural support for the cells 108 that are situated between the endcaps 154. The posts 166 constrain the cells 108 in a predetermined, desired position with respect to the endcaps 154 and to one another, prior to forming an electrical connection between the plates 164 and the cells 108.

Conductive tabs 168 extend from the plates 164 to the top of the endcaps 154. These conductive tabs 168 provide an electrical connection from the plates 164 to the printed circuit board 162 (not shown) that is situated on the top of each pair of endcaps 154. These tabs 168 provide electrical access for the module monitor 110 (resident on the printed circuit board 162) to the cells 108 within the module 102.

Figure 10:
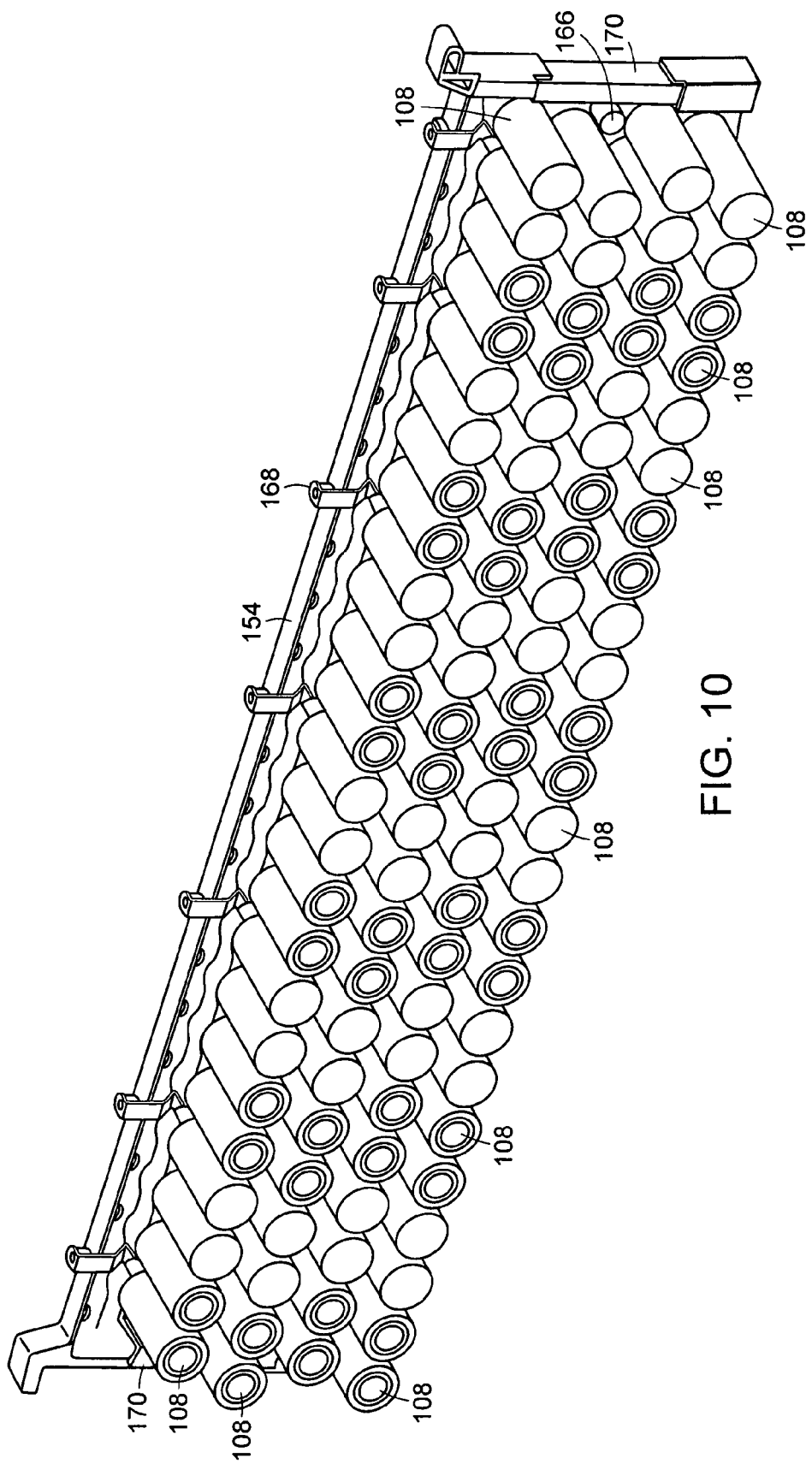
FIG. 10 shows still another view of the components of the EDD module of FIG. 7.

FIG. 10 shows an array of cells 108 arranged between the posts 166 of the endcap 154. For clarity, only a few of the cells 108 are labeled with reference numbers in this figure. As shown, the cells 108 are arranged in parallel-connected groups of alternating polarity, so that the groups of cells 108 can be electrically connected in series back and forth between the endcaps 154. End conductors 170 are situated at each end of the endcaps 154 at the extremes of the series connected groups of cells.

Figure 11:
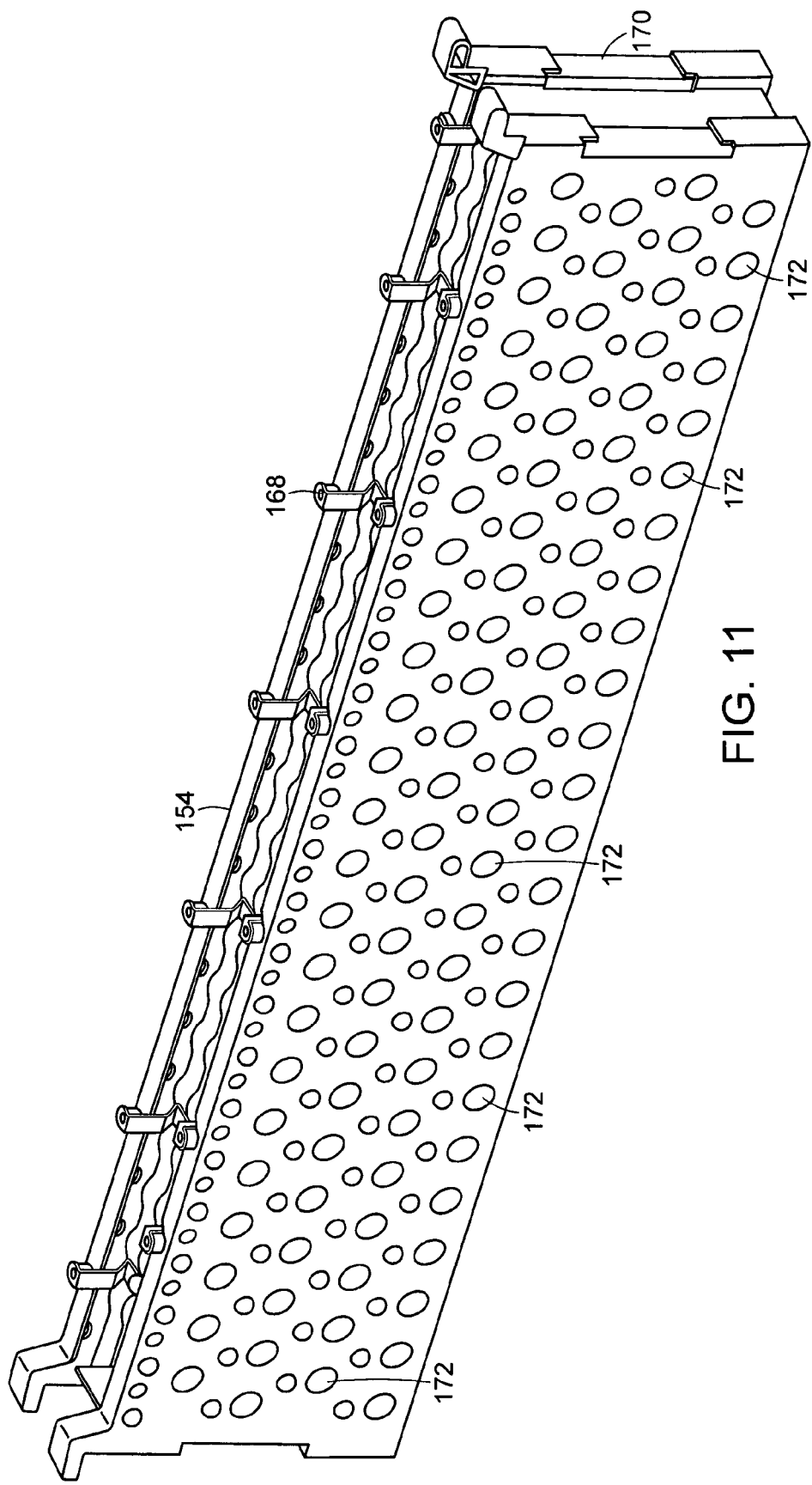
FIG. 11 shows another view of the components of the EDD module of FIG. 7.

FIG. 11 shows an assembled module 102, similar to what is shown in FIG. 8, but without the insulating sheet 156. The cells 108 are securely clam-shelled between the endcaps 154, which are then screwed together at a number of points across the endcaps 154 for structural support. Access ports 172 (i.e., holes) in the endcaps 154 expose the exterior surface of the conductive plates 164, at the location where each cell contacts the conductive plate 164 on the interior surface of the plate 164. Again, for clarity only a few of the ports 172 are designated with reference numbers in the figure. The cells 108 are then resistance welded to the conductive plates 164 via the access ports 172. This order of assembly and the structure provided by the posts 166 is key to the prevention of stress on the welds.

Figure 12:
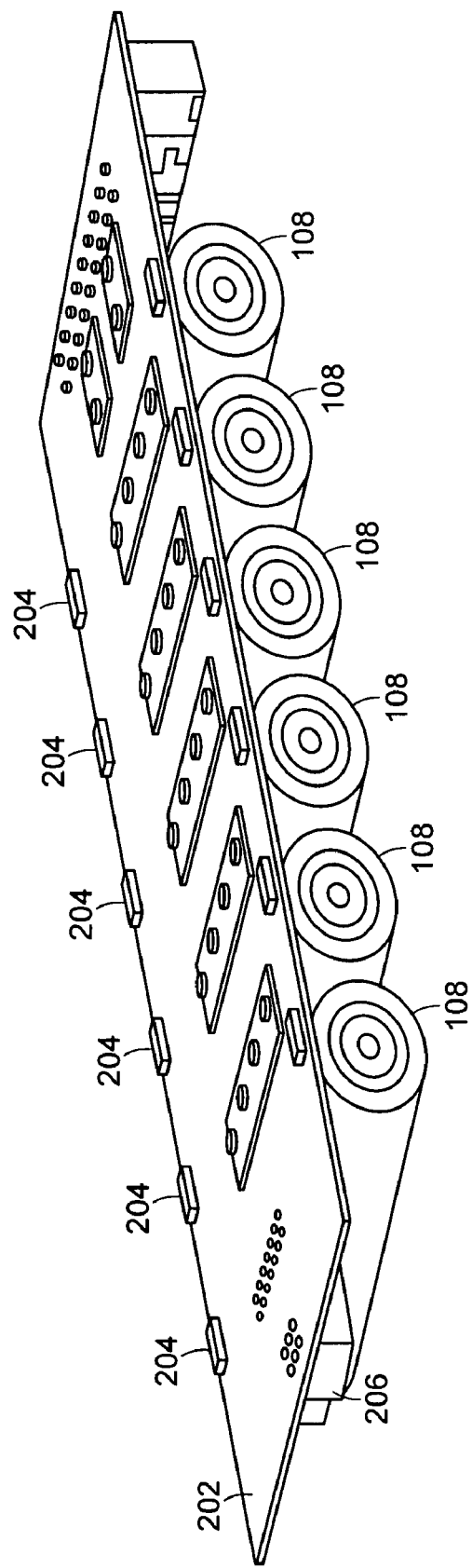
FIG. 12 shows an EDD pack as a group of cells mounted on a printed circuit board.

In one embodiment, an EDD pack 200 is a group of cells 108 mounted on a printed circuit board 202 (PCB) as shown in FIG. 12. The PCB 202 hosts the electrical contacts 204 for connecting to the cells and conducting the current the cells provide. The cells 108 are electrically coupled to the PCB 202 via electrical contacts 204 welded to the terminals of each cell 108, which are then soldered to the PCB 202. The cells 108 may also be physically coupled to the PCB 202 with an adhesive, mechanical fasteners (e.g., straps, clamps, etc.), or other techniques known in the art for physically attaching the cells 108 to the PCB 202.

The PCB 202 also hosts the cell to cell electrical interconnections necessary for electrically coupling the energy delivery devices to one another in a predetermined arrangement, thereby implementing the desired series connections, parallel connections, or combinations thereof, of the cells 108. Finally, the PCB 202 host various electronics 206, such as balancing devices, monitor and control devices, and other electrical components that provide the functionality related to monitoring, controlling and managing the EDD pack 200.

Figure 13:
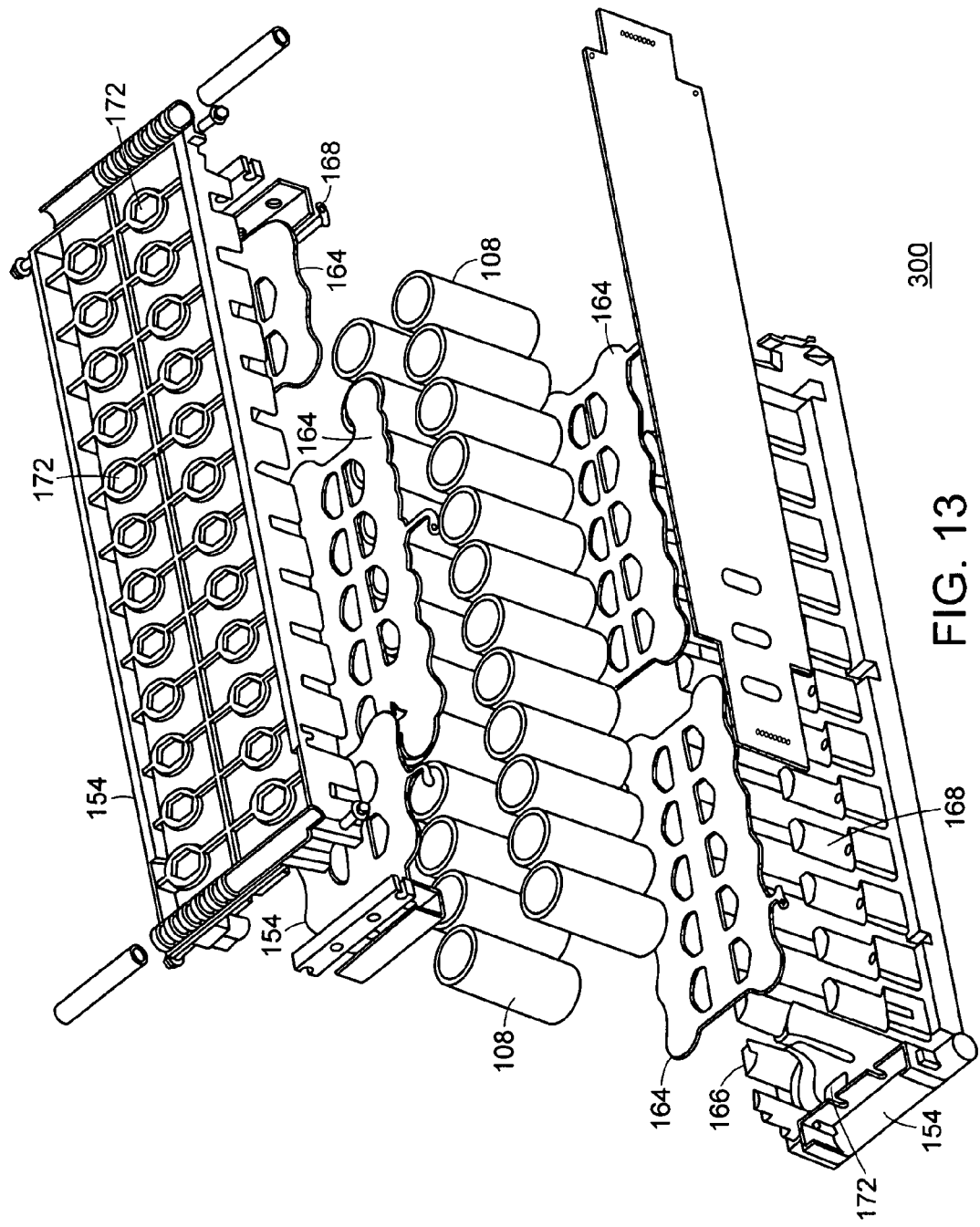
FIG. 13 shows an exploded view of yet another embodiment of an EDD pack.

FIG. 13 shows an exploded view of yet another embodiment of an EDD pack 300. This embodiment includes different versions of many of the components described herein, such as the cells 108, the endcaps 154, the conductive plates 164, the posts 166, the conductive tabs 168, and the access ports 172.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. An energy delivery system, comprising:
a plurality of strings, each string in the plurality comprising,
  (i) two or more energy delivery modules electrically coupled in series, wherein each energy delivery module includes one or more energy delivery devices for storing and delivering electric current, and a module monitor for monitoring and controlling each of the energy delivery devices in the energy delivery module, and
  (ii) a string communication path accessible to each of the energy delivery modules, wherein the module monitor of each energy delivery module is operable to communicate information associated with its energy delivery module through the string communication path;
a plurality of string manager devices for communicating with the module monitors in the strings through the string communication paths, each string manager device being respectively associated with a different string of the plurality of strings, wherein each string manager device is configured to independently communicate with the module monitors by sending an address specific message to the module monitors along its string communication path, such that a response is given by the module monitor that corresponds to the address specific message sent by the string manager device; and
a system controller for communicating with each string manager device through a system communication path.

2. The energy delivery system of claim 1, further including a device monitor for monitoring and controlling each energy delivery device, wherein each device monitor communicates with the module monitor such that the module monitor functions as a proxy for the device monitors and the energy delivery devices.

3. The energy delivery system of claim 1, wherein the information associated with the energy delivery module includes electrical characteristics of the energy delivery module.

4. The energy delivery system of claim 1, wherein the information associated with the energy delivery module includes commands for controlling the energy delivery module.

5. The energy delivery system of claim 1, wherein the information associated with the energy delivery module includes instructions for configuring a predetermined arrangement of the modules within the system.

6. The energy delivery system of claim 1, wherein the information associated with the energy delivery module includes environmental information associated with the module.

7. The energy delivery system of claim 1, further including one or more isolating switches for isolating an abnormal module from the communication path.

8. The energy delivery system of claim 1, wherein the communication path is a wire communication bus that supports an addressed communication protocol.

9. The energy delivery system of claim 1, wherein the system controller subsumes at least one of the string managers, so that the system controller provides functionality associated with the at least one of the string managers.

10. The energy delivery system of claim 1, wherein each string manager accommodates more or fewer modules in the string, and the system manager accommodates more or fewer string managers in the system.

11. An energy delivery system, comprising:
a plurality of energy delivery devices, wherein each energy delivery device is operable to store energy provided to it and deliver stored energy as electrical current;
a plurality of first electrical devices for providing functionality related to at least one of monitoring, controlling and managing the plurality of energy delivery devices;
a plurality of string communication paths associated with the plurality of first electrical devices;
a plurality of second electrical devices for communicating with the plurality of first electrical devices through the plurality of string communication paths, each of the second electrical devices being separately associated with a corresponding one of the string communication paths, wherein the plurality of second electrical devices are configured to independently communicate with the first electrical devices by sending address specific messages to the first electrical devices, such that responses are given by the first electrical devices that correspond to the address specific messages sent by the second electrical devices; and
a printed circuit board including:
    (i) electrical contacts for electrically coupling the energy delivery devices to the printed circuit board, and,
    (ii) electrical conductors for electrically coupling the energy delivery devices to one another in a predetermined arrangement, and for coupling the energy delivery devices to the plurality of first electrical devices;
wherein the plurality of energy delivery devices and the plurality of first electrical devices are mounted directly to the printed circuit board.

12. A method of assembling an energy delivery system, comprising:
providing a pair of endcaps, wherein the endcaps include (i) posts for constraining an array of energy delivery devices in a predetermined arrangement, (ii) electrically conductive plates for providing an electrical connection to the energy delivery devices, and (iii) access ports for accessing the electrically conductive plates through the endcaps at locations corresponding to electrical ports of the energy delivery devices, the access ports are formed in an exterior surface of the electrically conductive plates;
disposing the energy delivery devices between the endcaps, such that the posts constrain the energy delivery devices in the predetermined arrangement, and the electrical ports of the energy delivery devices are in contact with the electrically conductive plates;
securing the endcaps together, so as to clamp the batteries between the endcaps in the predetermined arrangement;
applying heat through the access ports to the electrically conductive plates, which forms an electrically conductive bond between the electrical ports of the energy delivery devices and predetermined locations on the electrically conductive plates.

13. The method according to claim 12, further wherein the posts are configured to protrude from an interior surface of the electrically conductive plates, such that the posts constrain the energy delivery devices to reduce stress on the bonds.

14. The method according to claim 12, wherein applying heat through the access ports further includes resistance welding the conductive plate.

15. The method according to claim 12, further including disposing a printed circuit board at a top portion of the endcaps, wherein one or more conductive tabs extending from the conductive plates provide an electrical coupling between the cells and the printed circuit board.

16. The method according to claim 12, further including providing a frame for arranging two or more modules in a predetermined configuration.

17. An energy delivery system, comprising:
a pair of endcaps, wherein the endcaps include (i) posts for constraining an array of energy delivery devices in a predetermined arrangement, (ii) electrically conductive plates for providing an electrical connection to the energy delivery devices, and (iii) access ports for accessing the electrically conductive plates through the endcaps at locations corresponding to electrical ports of the energy delivery devices, the access ports are formed in an exterior surface of the electrically conductive plates;
wherein the energy delivery devices are disposed between the endcaps, such that the posts constrain the energy delivery devices in the predetermined arrangement, and the electrical ports of the energy delivery devices are in contact with the electrically conductive plates;
wherein the endcaps are secured together, so as to clamp the batteries between the endcaps in the predetermined arrangement; and,
wherein an electrically conductive bond is formed between the electrical ports of the energy delivery devices and predetermined locations on the electrically conductive plates by applying heat through the access ports to the electrically conductive plates.

18. The energy delivery system of claim 17, further including a printed circuit board disposed at a top portion of the endcaps, wherein the printed circuit board is electrically coupled to one or more tabs extending from the electrically conductive plates.

19. The energy delivery system of claim 18, furthering including an electrical connector for coupling to a communication path, wherein the electrical connector is electrically coupled to one or more electrical devices mounted on the printed circuit board.

20. The energy delivery system of claim 17, wherein the energy delivery devices are arranged in groups of alternating polarity, such that the groups of energy delivery devices are electrically connected in series.

21. The energy delivery system of claim 17, wherein the energy delivery devices are arranged in groups that are electrically connected in parallel.

22. The energy delivery system according to claim 17, wherein the posts are configured to protrude from an interior surface of the electrically conductive plates, such that the posts constrain the energy delivery devices to reduce stress on the bonds.

* * * * *